United States Patent
Zhou et al.

(10) Patent No.: US 6,528,998 B1
(45) Date of Patent: Mar. 4, 2003

(54) METHOD AND APPARATUS TO REDUCE THE EFFECTS OF MAXWELL TERMS AND OTHER PERTURBATION MAGNETIC FIELDS IN MR IMAGES

(75) Inventors: Xiaohong Zhou, Houston, TX (US); Joseph K. Maier, Milwaukee, WI (US); Steven J. Huff, Hartland, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 09/540,768

(22) Filed: Mar. 31, 2000

(51) Int. Cl.⁷ ................................................. G01V 3/00
(52) U.S. Cl. ........................................ 324/309; 324/307
(58) Field of Search ................................. 324/309, 307, 324/306, 314, 312, 318, 322

(56) References Cited

U.S. PATENT DOCUMENTS

| | | | | |
|---|---|---|---|---|
| 4,985,677 A | | 1/1991 | Pauly ........................... 324/309 |
| 5,151,656 A | | 9/1992 | Maier et al. ................. 324/309 |
| 5,351,006 A | * | 9/1994 | Sumanaweera et al. ...... 324/309 |
| 5,378,985 A | | 1/1995 | Hinks ........................... 324/309 |
| 5,869,965 A | | 2/1999 | Du et al. ..................... 324/309 |
| 5,877,629 A | * | 3/1999 | King et al. .................. 324/309 |
| 5,923,168 A | | 7/1999 | Zhou et al. .................. 324/309 |
| 6,057,685 A | * | 5/2000 | Zhou ........................... 324/306 |
| 6,249,595 B1 | * | 6/2001 | Foxall et al. ............... 382/128 |

OTHER PUBLICATIONS

X, Zhou, et al., "On phase artifacts of high-field fast spin echo", SMRM Abstracts, p. 1248, 1993.

Ahn and Cho, "A new phase correction method in NMR imaging based on autocorrelation and histogram analysis", IEEE Trans. Med. Imaging, vol. MI–6, No. 1, pp 32–36, Mar. 1987.

* cited by examiner

Primary Examiner—Edward Lefkowitz
Assistant Examiner—Tiffany A. Fetzner
(74) Attorney, Agent, or Firm—ZiolkowskiPatent Solutions Group; Michael A. DellaPenna; Carl B. Horton

(57) ABSTRACT

A method and apparatus for correcting ghosting artifacts that are related to Maxwell fields and/or other perturbation magnetic fields is disclosed. The method and apparatus includes acquiring MR image n-space data and an MR reference scan, each having perturbation field effects therein. After determining phase correction values from the MR reference scan and reconstructing an MR image using the phase correction values, a projection phase error is calculated from the reconstructed MR image and then subtracted from the reference scan, the result of which is used to determine a new set of phase correction values. The new set of phase correction values is applied to the acquired MR image data to reconstruct a new image. The reconstructed new image can then be reused to calculate a new projection phase error, which again is subtracted from the reference scan data and the process is repeated until an image of desired ghost artifact reduction is achieved.

21 Claims, 2 Drawing Sheets

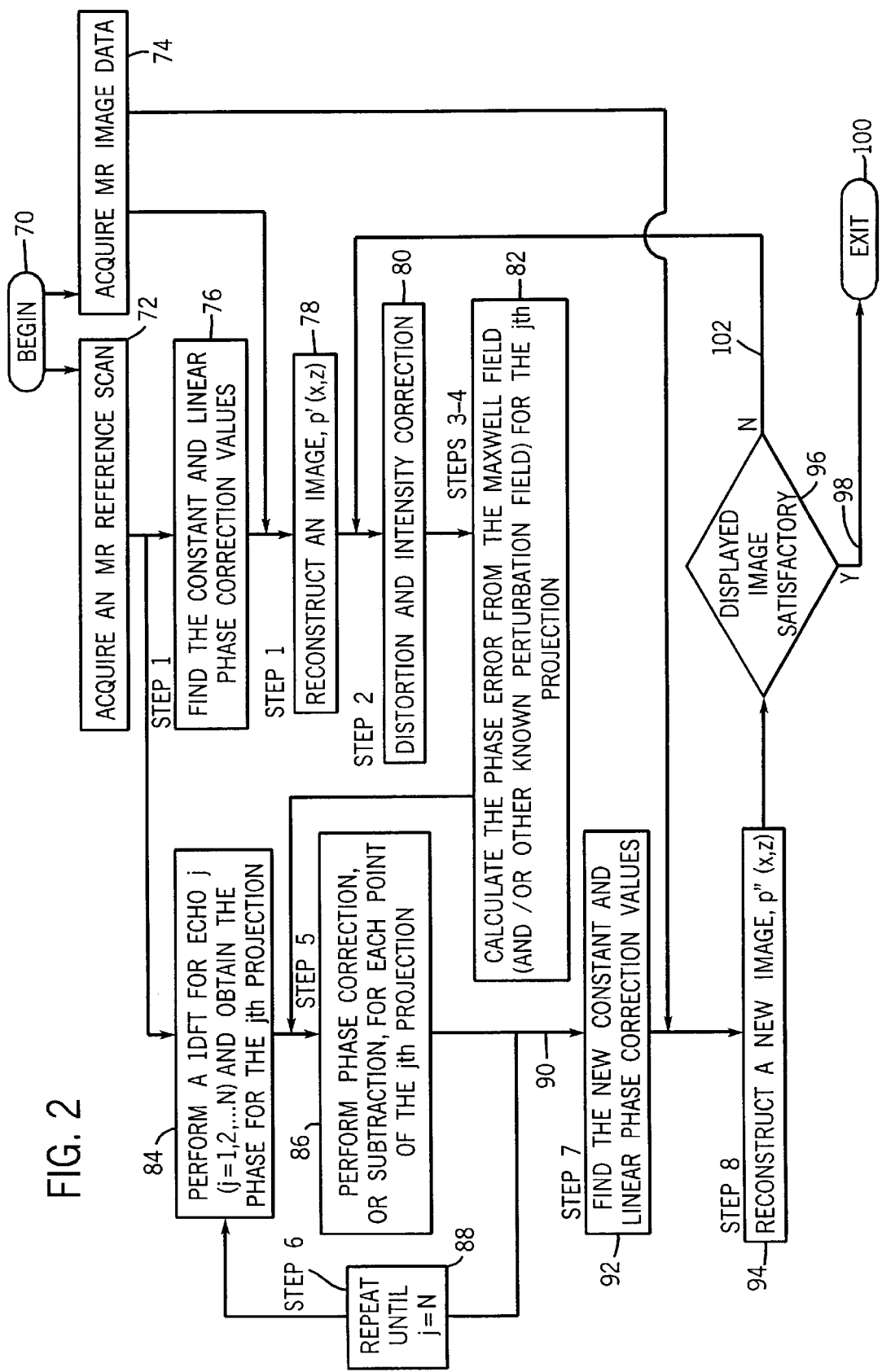

METHOD AND APPARATUS TO REDUCE THE EFFECTS OF MAXWELL TERMS AND OTHER PERTURBATION MAGNETIC FIELDS IN MR IMAGES

BACKGROUND OF THE INVENTION

The present invention relates generally to magnetic resonance imaging (MRI), and more particularly to a method and apparatus to reduce ghosting artifacts resulting from Maxwell fields and/or other perturbation magnetic fields in MR images acquired using fast imaging techniques.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is at or near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, and $G_z$) produce artifacts in the reconstructed images. It is a well known problem, for example, that eddy currents produced by gradient pulses will distort the gradient fields and produce image artifacts. Methods for compensating for such eddy current errors are also well known as disclosed, for example, in U.S. Pat. Nos. 4,698,591; 4,950,994; and 5,226,418. It is also well known that the gradients may not be perfectly uniform over the entire imaging volume, which may lead to image distortion. Methods for compensating this non-uniformity are described, for example, in U.S. Pat. No. 4,591,789.

Other than uncompensated eddy current errors and gradient non-uniformity errors that escape correction, it can be assumed that the magnetic field gradients ($G_x$, $G_y$, and $G_z$) produce linear magnetic fields exactly as programmed, thus spatially encoding the NMR data accurately. With these gradients, the overall static magnetic field at location (x,y,z) is conventionally given as $B_0+G_x(x)+G_y(y)+G_z(z)$, and the direction of the field is usually thought to be along the z-axis. This description, however, is not exactly correct. As long as a linear magnetic field gradient is applied, the overall magnetic field direction is changed from the z-axis and its amplitude exhibits higher-order spatial dependencies ($x^2$, $y^2$, $z^2$, $z^3$, ...). These phenomena are a direct consequence of the Maxwell equations which require that the overall magnetic field satisfy the following two condition: $\nabla \cdot \vec{B}=0$ and $\nabla \times \vec{B} \approx 0$. The higher-order magnetic fields, referred to as "Maxwell terms" (or Maxwell fields), represent a fundamental physics effect, and are not related to eddy currents or imperfection in hardware design and manufacture.

Many MR scanners still in use to produce medical images require several minutes to acquire the necessary data. The reduction of this scan time is an important consideration, since reduced scan time increases patient throughput, improves patient comfort, improves image quality by reducing motion artifacts and enables dynamic and functional studies. There is a class of pulse sequences which can acquire an image in seconds, or even sub-second, rather than minutes.

One of these fast imaging techniques is the Rapid Acquisition Relaxation Enhanced (RARE) sequence which is described by J. Hennig et al. in an article in *Magnetic Resonance in Medicine* 3,823–833 (1986) entitled "RARE Imaging: A Fast Imaging Method for Clinical MR." A slight variation of the RARE sequence produces a fast spin echo (FSE) sequence which is used for clinical diagnosis in many commercial scanners. Images acquired using an FSE sequence are very susceptible to artifacts caused by eddy currents induced by the rapidly changing magnetic field gradients. While eddy current compensation techniques are adequate for scans performed with conventional MRI pulse sequences, it has been observed that image artifacts caused by eddy currents are frequently present in FSE scans.

Echo-planar imaging ("EPI") is another ultrafast MR imaging technique which is extremely susceptible to system imperfections, such as eddy currents and gradient group delays. In the presence of eddy currents, ghosting artifacts can considerably degrade the image quality and adversely affect EPI's diagnostic value.

To minimize the ghosts created by such fast imaging techniques using echo trains, such as FSE and EPI, a common approach is to employ a reference scan prior to the actual image acquisition. In these reference scans, signals from a full echo train are acquired in the absence of the phase-encoding gradient. Each echo in the echo train is Fourier transformed along the readout direction to obtain a set of projections. Spatially constant and linear phase errors, $\phi_0$ and $\phi_1$, are then extracted from the projections, followed by phase corrections using $\phi_0$ and $\phi_1$, either during image acquisition, as in the case of FSE, or in image reconstruction, as in the case of EPI.

This type of phase correction assumes that spatially varying magnetic fields along the phase-encoding direction are negligible during the reference scans. However, when the Maxwell terms are considered, this assumption does not hold, especially when a strong gradient is used at relatively low main magnetic $B_0$ fields. In the presence of the Maxwell terms, signal dephasing along the phase-encoding direction can introduce substantial errors in the constant and linear phase calculations. The perturbation of Maxwell terms to the reference scans may be evidenced by the fact that the aforementioned phase correction method works markedly well for axial EPI scans performed on a horizontal superconducting magnet, but not for sagittal and coronal scans. In the former case, the EPI readout gradient does not produce Maxwell terms on the phase-encoding axis, whereas in the latter cases substantial Maxwell terms can be produced. In addition to the Maxwell terms, other factors, such as cross-term linear eddy currents from any gradients to the phase-encoding axis, the magnetic field inhomogeneity in the phase-encoding direction, and magnetic hysteresis, can also cause the perturbations to the reference scans, resulting in incomplete or erroneous phase correction.

It would therefore be desireable to have a technique to minimize the effects of the Maxwell terms, as well as other known perturbations, on reference scans using an iterative algorithm to thereby reduce ghosting and other image artifacts.

SUMMARY OF THE INVENTION

The present invention relates to a method and system to reduce Maxwell field effects and other perturbation field effects in MR images that overcomes the aforementioned problems.

The invention uses an iterative algorithm in which an image is first reconstructed using extracted constant and linear phase correction values that are obtained in the presence of Maxwell term perturbations. The image is corrected for the Maxwell term induced distortion to yield a new image, which is then used to calculate a phase perturbation error. Once calculated, the phase perturbation error is removed from the projection of the reference scan. With the phase perturbation error being removed from the reference scan, new constant and linear phase correction values are re-calculated from the reference scan, and are used to reconstruct an image with reduced perturbation field effects. The process is repeated until a satisfactory ghost level is achieved.

In accordance with one aspect of the invention, a method to reduce perturbation field effects in MR images includes acquiring an MR image data set having perturbation field effects and acquiring a one-dimensional MR reference scan also having perturbation field effects. The method includes determining phase correction values for the MR reference scan and reconstructing an MR image using the MR image data and the phase correction values. After calculating a projection phase error using the MR image, phase correction on the MR reference scan is performed using the calculated projection phase error to create new reference scan data.

In accordance with another aspect of the invention, a method of reducing ghost artifacts in MR images includes obtaining phase correction values in the presence of Maxwell term perturbations from a reference scan and reconstructing an image using the phase correction values and the acquired MR image k-space data. The method next includes geometrically correcting the image to compensate for Maxwell term induced distortion to create a new image, then calculating a phase perturbation and removing the calculated phase perturbation from the referenced scan.

In accordance with yet another aspect of the invention, an MRI apparatus is disclosed to create MR images acquired with a fast imaging technique that have reduced ghost artifacts. The apparatus includes an MRI system having a plurality of gradient coils positioned about a bore of a magnet to impress a polarizing magnetic field, an RF transceiver system, and an RF switch controlled by a pulse module to transmit RF signals to an RF coil assembly to thereby acquire MR images. The MRI apparatus includes a computer program to acquire an MR reference scan and an MR data set using a fast imaging acquisition pulse sequence where each has perturbation field effects therein. After phase correction values are determined from the MR reference scan, a first MR image is reconstructed using the MR image data set and the phase correction values. A projection phase error is calculated for the first MR image and removed from the MR reference scan to create new reference scan data. A new MR image is reconstructed and displayed which has reduced perturbation field effects. The algorithm is repeated until the displayed MR image has satisfactorily reduced ghost artifacts.

In accordance with yet another aspect of the invention, a computer program is disclosed for use with an MRI apparatus which, when executed by a computer, causes the computer and MRI system to acquire an MR reference scan and MR image data, then obtain phase correction values in the presence of Maxwell term perturbations from the reference scan, reconstruct an image using the phase correction values and the MR image data, geometrically correct the image to compensate for Maxwell term induced distortion and intensity shading to create a new image, and then calculate a phase perturbation and remove the calculated phase perturbation from the MR reference scan. New phase correction values are calculated and a new image is reconstructed using the new phase correction values. The steps of calculating a phase perturbation, removing the calculated phase perturbation from the MR reference scan, calculating new phase correction values, and reconstructing a new image are repeated until a desired ghost artifact reduction is achieved in the final image.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings:

FIG. 2 is a flow chart showing an implementation of the present invention for use with the system of FIG. 1.

DETAILED DESCRIPTION OF THE PREFERRED EMBODIMENT

Figure 1:
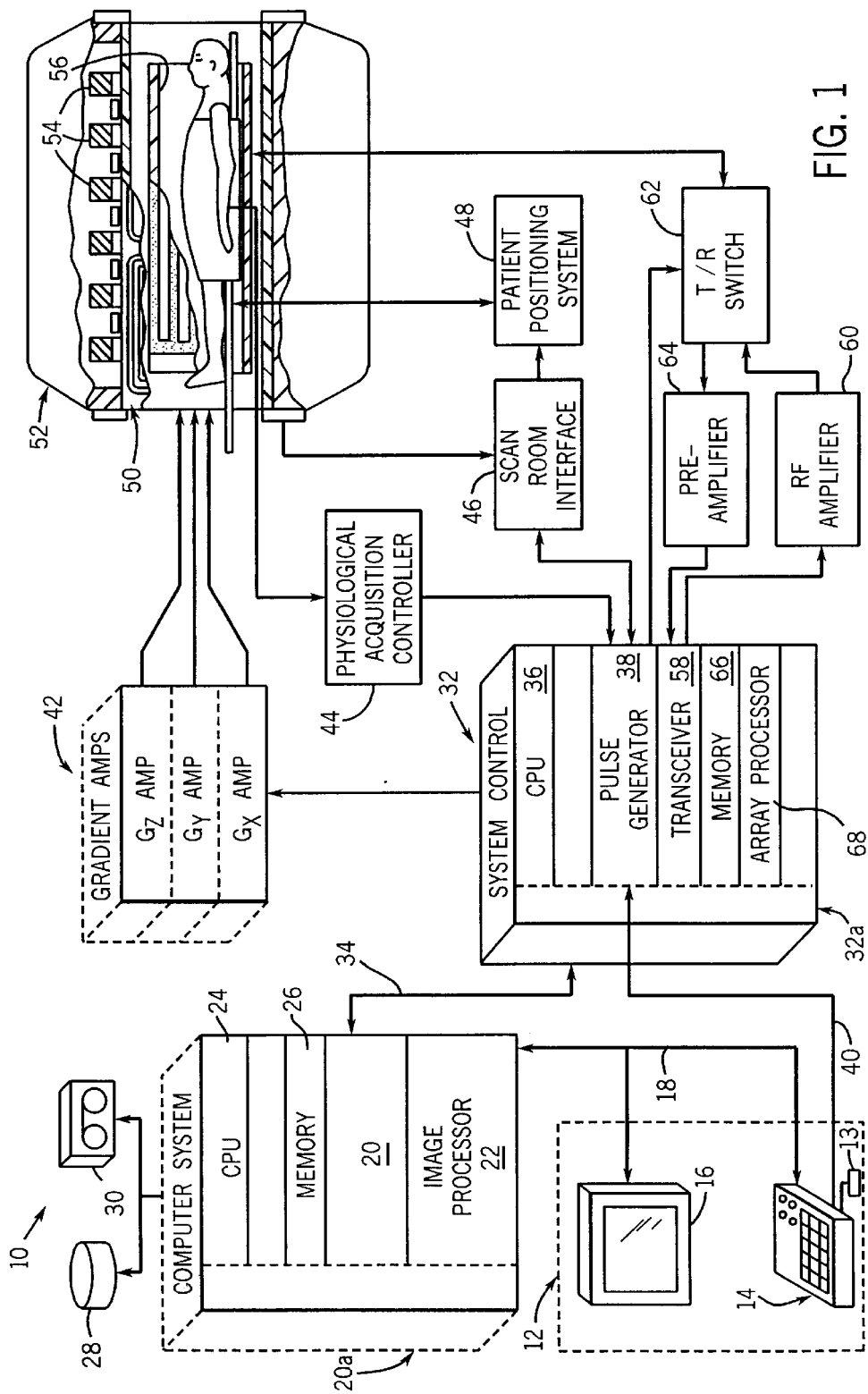
FIG. 1 is a schematic block diagram of an MR imaging system for use with the present invention.

Referring to FIG. 1, the major components of a preferred MRI system 10 incorporating the present invention are shown, The operation of the system is controlled from an operator console 12 which includes a keyboard or other input device 13, a control panel 14, and a display or screen 16. The console 12 communicates through a link 18 with a separate computer system 20 that enables an operator to control the production and display of images on the screen 16 The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 call include a mouse, joystick, keyboard, track ball, touch screen, light wand, voice control, or similar device, and may be used for interactive geometry prescription The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified NMR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The NMR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR images, that when used with a fast-imaging technique, such as fast spin echo (FSE) or echo planar imaging (EPI), minimizes ghosting effects caused by Maxwell terms and/or other perturbation magnetic fields.

Referring to FIG. 2, a system and method for use with the apparatus of FIG. 1 is disclosed in flow chart form. An overview of the system and method of the present invention will first be described with reference to the flow chart of FIG. 2, and a detailed mathematical explanation will then follow. Upon initialization 70 the system acquires an MR reference scan 72 and MR image data 74, in the form of raw k-space data, each using a fast imaging technique. Such techniques involve using echo trains such as FSE and EPI. An example of the FSE pulse sequence is shown in U.S. Pat. No. 5,378,985 and an example of an EPI pulse sequence is shown in U.S. Pat. No. 5,923,168.

After acquisition of the MR image data and the MR reference scan, each having perturbation field effects, the constant and linear phase correction values are determined 76. An MR image $\rho'(x, z)$ is reconstructed 78 using the MR image data 74 and the phase correction values 76. For a further explanation in determining the phase correction values 76 and reconstructing the image $\rho'(x, z)$ 78, reference is made to U.S. Pat. No. 5,151,656. Next, since the perturbation errors cause image distortion and intensity shading, the reconstructed image $\rho'(x, z)$ obtained in step 78 then undergoes geometric distortion and intensity correction 80, as described in U.S. Pat. No. 5,869,965. The corrected image $\rho(x, z)$, is then used to calculate a projection phase error 82 caused by the Maxwell field or other perturbation magnetic fields for each projection in the reference scan.

Simultaneously, the MR reference scan obtained in step 72, which has a plurality of echoes j, undergoes a one-dimensional Fourier transform for each echo in the phase for a corresponding projection 84, thereby forming a projection phase for each echo of the MR reference scan. Phase correction is then performed 86 using the calculated projection phase error from 82 and the projection phase from 84 for each spatial point in the respective projection. In particular, the phase correction is accomplished by subtracting the calculated projection phase error from each point of each projection of the MR reference scan. That is, steps 84 and 86 are repeated 88 for each echo and corresponding projection in the MR reference scan. Once each point, and each projection, has undergone phase correction, new reference scan data 90 are used to calculate new constant and linear phase correction values 92, which are then used, together with the acquired MR image data 74 to reconstruct a new image $\rho''(x, z)$ 94, having reduced perturbation field effects.

The new image is then displayed, and if satisfactory to an MR user 96, 98, the process is complete 100. However, reiterations will likely be needed to satisfactorily remove the ghost effects created by the perturbation field effects. Accordingly, if the image is not yet satisfactory 96, 102, a new projection phase error is calculated 82 based on the new image $\rho''(x, z)$ with distortion and intensity correction 80. In turn, the new projection phase error is then removed from the last reference scan data 90 to create another set of new reference scan data 90 from which new constant and linear phase correction values 92 can be determined. After another new image is reconstructed 94, a user can again check to see if the displayed image is satisfactory. The system can continue to reduce the perturbation field effects, and the associated ghosting, until the displayed MR image has sufficiently reduced these artifacts for a given image and user. It is contemplated, and within the scope of this invention, that the quantitative ghost detection can be equivalently done by the computer system without operator input automatically, or semi-automatically with occasional user input.

The mathematical analysis will now be presented. To analyze the effects of Maxwell terms, and other perturbation magnetic fields, an EPI reference scan performed on a coronal plane (i.e., the x-z plane in a horizontally oriented superconducting magnet with z being the magnetic field direction and x being the horizontal direction) is considered. However, it is understood that employing a coronal EPI reference scan is for demonstrative purposes and the method and apparatus of the present invention is equally applicable to other imaging planes and other pulse sequences where the perturbation from Maxwell terms, or other known magnetic fields B(t,z) is problematic. For example, the present invention can be extended to non-EPI techniques employing echo trains, such as FSE; gradient and spin echo (GRASE), described by Oshio, K. and Feinberg, D. A. in an article published in *Magnetic Resonance in Medicine*, Vol.: 20, pp 344–349, (1991), entitled: *GRASE (Gradient and Spin-echo) Imaging: A Novel Fast MRI Technique*; and BURST imaging, described by Hennig, J. and Mueri, M., in an article published in the Abstracts of the Society of Magnetic Resonance in Medicine, pp 238, (1988) entitled: *Fast Imaging Using Burst Excitation Pulses*.

The coronal EPI reference scan is taken with the read-out gradient ($G_x$) along the X-axis and the phase-encoding (PE) gradient along the Z-axis (the direction of the static magnetic field). At static magnetic fields $B_0$, a Maxwell term produced by the read-out gradient is given by:

$$B_M(t, z) = \frac{G_x^2(t)}{2B_0} z^2, \qquad [1]$$

where t is the time. In additional to the Maxwell field, other perturbation fields with known analytical expressions, B(t, z), may also exist. In the presence of the Maxwell term and B(t,z), the NMR signal of echo j in the reference scan becomes:

$$S_j(k_x) = \iint_{x,z} \rho(x, y) e^{-ik_x x} e^{-i\varphi_{0j}} e^{-i\varphi_{1j} x} e^{-i[\varphi_{Mj}(t,z)+\varphi_{Bj}(t,z)]} dx\,dz, \qquad [2]$$

$$\varphi_{Mj}(t, z) = 2\pi\gamma \int_0^t B_M(t', z) dt', \qquad [2a]$$

$$\varphi_{Bj}(t, z) = 2\pi\gamma \int_0^t B(t', z) dt', \qquad [2b]$$

where $\rho(x, z)$ is the spin density function of the imaging object, $\gamma$ is the gyromagnetic ratio, $k_x$ is the Fourier conjugate of the spatial variable x, and $\phi_{0j}$ and $\phi_{1j}$ are the nominal constant and linear phase errors, respectively. The constant phase error is typically caused by $B_0$ eddy currents that are time variant and spatially invariant. The linear phase error can arise from eddy currents acting on the readout gradient axis that are time variant and spatially variant, as well as the readout gradient group delays. Taking a one-dimensional Fourier transform (1D FT) Eq. [2] becomes, $$P_j(x') = \int_{k_x} S_j(k_x) e^{ik_x x'} dk_x \qquad [3]$$
$$= e^{-i\varphi_{0j}} \iint_{x,z} \rho(x, y) e^{-i\varphi_{1j} x} \int_{k_x} e^{-ik_x(x-x')} e^{-i[\varphi_{Mj}(t,z)+\varphi_{Bj}(t,z)]} dk_x\,dx\,dz.$$

Since $\phi_{Mj}$ and $\phi_{Bj}$ depend on t, which in turn is a function of $k_x$, the last phase term cannot be taken out of the integral with respect to $k_x$. However, if the instantaneous values for $\phi_{Mj}$ and $\phi_{Bj}$ are used at the center of the echo to approximate the Maxwell phase and the B(t,z) related phase (Eq. [2b]) for the entire echo j, Eq. [3] can be simplified to:

$$P_j(x') = \qquad [4]$$
$$e^{-i\varphi_{0j}} \iint_{x,z} \rho(x, y) e^{-i\varphi_{1j} x} e^{-i[\Psi_{Mj}(z)+\Psi_{Bj}(z)]} \int_{k_x} e^{-ik_x(x-x')} dk_x\,dx\,dz,$$

where $\Psi_{Mj}$ and $\Psi_{Mj}$ are the instantaneous values for $\phi_{Mj}$ and $\phi_{Bj}$ at the jth echo center, respectively. In light of the orthonormal property of the Fourier series, which states that the integral with respect to $k_x$ is non-zero only if x=x', Eq. [4] can be written as:

$$P_j(x') = e^{-i\varphi_{0j}} e^{-i\varphi_{1j} x'} \int_z \rho(x', y) e^{-i[\Psi_{Mj}(z)+\Psi_{Bj}(z)]} dz. \qquad [5]$$

It can be seen from Eq. [5] that the nominal projection of the reference scan is modulated by $\Psi_{Mj}(z)$ and $\Psi_{Bj}(z)$. Since the modulation is inside the integral, it can affect both the projection phase and the amplitude. To remove these errors, two scenarios are separately considered: (a) $\Psi_{Bj}(z)$ is made negligible using existing methods, including active gradient shielding, eddy current compensation and magnet shimming; and (b) $\Psi_{Bj}(z)$ is non-negligible, but is known through measurements, such as eddy current calibration disclosed in U.S. Pat. No. 4,950,994 and magnetic field inhomogeneity characterization disclosed in U.S. Pat. No. 5,168,232. In the first case, only the Maxwell term effects need correction. To do so, the present invention includes the following steps.

Step 1:

Using the reference scan data 72, which is contaminated by the Maxwell terms, the constant and linear phase errors $\phi'_0$ and $\phi'_1$ 76 are extracted. An EPI phase correction is performed using $\phi'_0$ and $\phi'_1$ followed by reconstruction of an image denoted as $\rho'(x,z)$ 78.

Step 2:

Since the Maxwell term causes image distortion and intensity shading, the image $\rho'(x,z)$ obtained in Step 1 is then corrected for geometric distortion using one of the methods described in U.S. Pat. No. , 5,869,965. The corrected image is then denoted as $\rho(x,z)$ 80.

Step 3:

The Maxwell term induced phase error is then calculated for each z-coordinate in the image $\rho$ for the jth echo (j ranges from 1, 2, . . . N) in the echo train using the following equation:

$$\Psi_{Mj}(z) = 2\pi\gamma \int_0^{t_j} B_M(t', z) dt', \qquad [6]$$

where $t_j$ is the time point of the jth echo center.

Step 4:

Using $\rho(x,z)$ and $\Psi_{Mj}(z)$ obtained from Steps 2 and 3, respectively, the projection phase error caused by the Maxwell terms is calculated according to the following equation:

$$\eta_j(x) = \arg\left(\int_z \rho(x, z) e^{-i\Psi_{Mj}(z)} dz\right), \qquad [7]$$

where arg represents the phase of complex data.

Step 5:

$\eta_j(x)$ is then subtracted from the projection phase of the reference scan originally obtained from the jth echo as follows:

$$\Gamma_j(x) = \arg(P_j(x)) - \eta_j(x). \qquad [8]$$

Note that the phase subtraction is performed for each point in the projection $P_j(x)$ with x being the variable denoting the different points along the read-out direction.

Step 6:

The above process is repeated for all the echoes j=1, 2, ... N, where N is the total number of echoes in the reference scan.

Step 7:

In order to obtain the constant and linear phases for each projection after the above corrective steps, a linear regression is performed on $\Gamma_j(x)$ with respect to x. The intercept and slope are then used as constant and linear phase errors, $\phi_0$ and $\phi_1$, respectively, as described in U.S. Pat. No. 5,151,656.

Step 8:

Using the newly obtained phase correction values $\phi_0$ and $\phi_1$, a phase correction is carried out on the MR image data 74, followed by an image reconstruction to obtain a new EPI image $\rho''(x,z)$.

Step 9:

Repeat steps 2–8, until the image is satisfactory.

In the second case where $\Psi_{Bj}(z)$ is non-negligible, steps 3 and 4 are modified in order to correct for both Maxwell term effect and the effect caused by other perturbations characterized by $\Psi_{Bj}(z)$. That is, in addition to $\Psi_{Mj}(z)$ $\Psi_{Bj}(z)$ is also calculated in Step 3 using Eq. [9]:

$$\Psi_{Bj}(z) = 2\pi\gamma \int_0^{\tau_j} B(t', z) dt', \quad [9]$$

and in Step 4, Eq. [7] is modified to:

$$\eta_j(x) = arg\left(\int_z \rho(x, z) e^{-i[\Psi_{Mj}(z) + \Psi_{Bj}(z)]} dz\right). \quad [10]$$

As mentioned earlier, although this analysis employs coronal EPI to demonstrate the present invention, it is equally applicable to other imaging planes where the perturbation from the Maxwell terms, or other known magnetic fields B(z,t), are problematic. The invention also has application to non-EPI techniques employing echo trains, such as FSE.

Accordingly, the invention includes an MRI apparatus to create MR images acquired using a fast imaging technique and having reduced ghost artifacts that includes an MRI system having a plurality of gradient coils positioned about a bore of a magnet to impress a polarizing magnetic field and also includes an RF transceiver system, which includes an RF modulator controlled by a pulse control module to transmit RF signals to an RF coil assembly in order to acquire the MR images. The MRI apparatus includes a computer programmed to acquire MR reference scans and MR k-space data using a fast imaging acquisition pulse, where each of the MR reference scan and the MR k-space data have perturbation field effects, such as the aforementioned Maxwell terms. The system then determines constant and linear phase correction values from the MR reference scan and reconstructs a first MR image using the MR image data and the phase correction values. A projection phase error is calculated from the first MR image and is removed from the MR reference scan to create new reference scan data. The MRI apparatus determines new phase correction values based on the new reference scan data and reconstructs the MR image from the original MR data set using the new phase correction values. This process is repeated until a displayed MR image has sufficiently reduced ghost artifacts for a given user. The first MR image is also geometrically corrected before calculating a projection phase error.

The invention also includes a computer readable storage medium, such as disk storage 28, tape drive 30, or any other data storage medium, having thereon a computer program comprising instructions for use with an MRI apparatus which, when executed by a computer, causes the computer to acquire MR reference scan and MR image data obtain phase correction values $\phi_0'$ and $\phi_1'$ in the presence of Maxwell-term perturbations from the reference scan; reconstruct an image $\rho'$ using the phase correction values $\phi_0'$ and $\phi_1'$ and the MR image data; geometrically correct the image $\rho'$ to compensate for Maxwell-term induced distortion to create a new image $\rho$; and calculate a phase perturbation and removing the calculated phase perturbation from the MR reference scan. The computer program further causes the computer to calculate new phase correction values $\phi_0$ and $\phi_1$ from the MR reference scan in which a previous calculated phase perturbation had been removed; reconstruct a new image $\rho''$ using the new phase correction values $\phi_0$ and $\phi_1$, and the MR image data; wherein the new image $\rho''$ has reduced Maxwell-term effects including ghost artifacts. The computer program further causes the computer to repeat the step of calculating a phase perturbation and removes the calculated phase perturbation from the MR reference scan, and repeats the aforementioned steps until a desired ghost artifact reduction is achieved.

The invention also includes a method of reducing ghost artifacts in MR images that employs an iterative algorithm. The method includes first obtaining phase correction values in the presence of Maxwell term and the other known perturbation magnetic fields from a reference scan and then reconstructing an image using the phase correction values and the acquired MR image data. The image is geometrically corrected to compensate for the Maxwell term induced distortion to create a new image. The method next includes calculating a phase perturbation and removing the calculated phase perturbation from the reference scan. Thereafter, new phase correction values are obtained from the reference scan data that has previously calculated phase perturbations removed. Next, a new image is reconstructed using the new phase correction values and the acquired MR image data. The new image thus has reduced Maxwell term effects including ghost artifacts. The step of calculating a phase perturbation and removing the calculated phase perturbation from the reference scan, and the steps of obtaining new phase correction values and reconstructing a new image, are each repeated until a desired ghost artifact reduction is achieved.

The present invention has been described in terms of the preferred embodiment, and it is recognized that equivalents, alternatives, and modifications, aside from those expressly stated, are possible and within the scope of the appending claims. For example, judgment on an acceptable ghost level can be accomplished by either an operator or an automatic algorithm. Further, the proposed technique is directed at producing the same reduced ghost level in sagittal/coronal images, as in axial images. Further yet, it is recognized that the invention is applicable to either manually or automatically detecting the imaged object, versus the background in each reconstructed image, and using the resulting binary mask to control which part of the entire image would actually contribute to the function $\rho(x,y)$ used in the phase-weighting integral to thereby reduce the present ghost effect on the perturbation field related phase error subtracted from the reference scan projections.

What is claimed is:

1. A method to reduce perturbation field effects in MR images comprising the steps of:
   (A) acquiring MR image data having perturbation field effects;
   (B) acquiring an MR reference scan having perturbation field effects;
   (C) determining phase correction values from the MR reference scan;
   (D) reconstructing an MR image using the MR image data and the phase correction values;
   (E) calculating a projection phase error from the MR image; and
   (F) performing phase correction using the calculated projection phase error to create new reference scan data.

2. The method of claim 1 wherein the step of performing phase correction is performed on the MR reference scan and the method further comprises:
   (G) determining new phase correction values from the new reference scan data;
   (H) reconstructing a new MR image from the MR image data and the new phase correction values, the new MR image having reduced perturbation field effects.

3. The method of claim 2 further comprising the step of repeating steps (E) through (H) until a satisfactory new MR image is reconstructed having reduced ghost artifacts.

4. The method of claim 1 wherein the MR reference scan is comprised of a plurality of echos and the method further comprises Fourier transforming each echo into a projection and wherein the step of performing phase correction includes subtracting the calculated projection phase error from each point of each projection of the MR reference scan.

5. The method of claim 1 further comprising the step of performing geometric distortion and intensity correction before the step of calculating a projection phase error.

6. The method of claim 1 wherein the step of calculating a projection phase error includes calculating a Maxwell term induced phase error for each coordinate in the MR reference image.

7. The method of claim 6 wherein the Maxwell term induced phase error is calculated according to:

$$\Psi_{Mj}(z) = 2\pi\gamma \int_0^{t_j} B_M(t', z) dt',$$

where j is a current echo, $\gamma$ is a gyromagnetic ratio, $B_M$ is a Maxwell perturbation field, $t_j$ is a time point of a jth echo center, j ranges from 1, 2, . . . N, where N is a total number of echoes, and Z is a spatial coordinate.

8. The method of claim 7 further comprising the step of performing geometric distortion and intensity correction before the step of calculating a projection phase error and wherein the projection phase error is given by:

$$\eta_j(x) = arg\left(\int_z \rho(x, z) e^{-i\Psi_{Mj}(z)} dz\right),$$

where arg represents a phase of a complex data set, $\rho(x,z)$ is an image of an object, and x is a coordinate of the MR reference scan and is orthogonal to the z spatial coordinate.

9. A method of reducing ghost artifacts in MR images comprising the steps of:
   obtaining phase correction values $\phi_0'$ and $\phi_1'$ in a presence of Maxwell-term perturbations from a reference scan;
   reconstructing an image $\rho'$ using the phase correction values $\phi_0'$ and $\phi_1'$ and acquired MR image data;
   geometrically correcting the image $\rho'$ to compensate for Maxwell-term induced distortion to create a new image $\rho$; and
   calculating a phase perturbation and removing the calculated phase perturbation from the reference scan.

10. The method of claim 9 further comprising the steps of:
    obtaining new phase correction values $\phi_0$ and $\phi_1$ from reference scan data in which a previous calculated phase perturbation had been removed;
    reconstructing a new image $\rho''$ using the new phase correction values $\phi_0$ and $\phi_1$ and the acquired MR image data, the new image $\rho''$ having reduced Maxwell-term effects thereby reducing ghost artifacts in the reconstructed new image $\rho''$.

11. The method of claim 10 further comprising the step of:
    repeating the step of calculating a phase perturbation and removing the calculated phase perturbation from the reference scan and repeating each step of claim 10, until a desired ghost artifact reduction is achieved.

12. The method of claim 9 wherein the phase perturbation is given by:

$$\eta_j(x) = arg\left(\int_z \rho(x, z) e^{-i[\Psi_{Mj}(z)+\Psi_{Bj}(z)]} dz\right),$$

where arg represents a phase of complex data, $\rho(x,z)$ is an image of an object, x is a coordinate of the MR reference scan and is orthogonal to a z spatial coordinate, and $\Psi_{Mj}(z)$ is given by:

$$\Psi_{Mj}(z) = 2\pi\gamma \int_0^{t_j} B_M(t', z) dt',$$

where j is a current echo, $\gamma$ is a gyromagnetic ratio, $B_M$ is a Maxwell perturbation field, $t_j$ is a time point of a jth echo center, and j ranges from 1, 2, . . . N, where N is a total number of echoes, and where $\Psi_{Bj}(z)$ is given by:

$$\Psi_{Bj}(z) = 2\pi\gamma \int_0^{t_j} B(t', z) dt',$$

where B is a perturbation field other than the Maxwell perturbation field.

13. An MRI apparatus to create MR images acquired using a fast imaging technique and having reduced ghost artifacts comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        acquire an MR reference scan and an MR data set using a fast imaging acquisition pulse sequence where each has perturbation field effects therein;
        determine phase correction values from the MR reference scan;
        reconstruct a first MR image using the MR image data set and the phase correction values;
        calculate a projection phase error from the first MR image;

remove the calculated projection phase error from the MR reference scan to create new reference scan data; and reconstruct and display an MR image having reduced perturbation field effects from the MR data set and the new reference scan data.

14. The MRI apparatus of claim 13 wherein the computer is further programmed to repeatedly:

determine new phase correction values based on the new reference scan data;

reconstruct the MR image based on the new phase correction values and the MR data set;

calculate a new projection phase error from the reconstructed MR image;

remove the calculated projection phase error from the new reference scan data, until a displayed MR image has sufficiently reduced ghost artifacts for a given user.

15. The MRI apparatus of claim 13 wherein the computer is further programmed to geometrically correct the first MR image before the act of calculating a projection phase error.

16. The MRI apparatus of claim 13 wherein the computer is further programmed to calculate the projection phase error according to:

$$\eta_j(x) = arg\left(\int_z \rho(x,z) e^{-i\Psi_{Mj}(z)} dz\right),$$

where arg represents a phase of a complex data set, $\rho(x,z)$ is an image of an object, x is a coordinate of the MR reference scan and is orthogonal to a z spatial coordinate, and $$\Psi_{Mj}(z) = 2\pi\gamma \int_0^{t_j} B_M(t', z) dt',$$

where j is a current echo, $\gamma$ is a gyromagnetic ratio, $B_M$ is a Maxwell perturbation field, $t_j$ is a time point of a jth echo center, and j ranges from 1, 2, ... N where N is a total number of echoes.

17. A computer readable storage medium having stored thereon a computer program for use with an MRI apparatus comprising instructions which, when executed by a computer, cause the computer to:

acquire an MR reference scan and MR image data;

obtain phase correction values $\phi_0'$ and $\phi_1'$ in a presence of Maxwell-term perturbations from the reference scan;

reconstruct an image $\rho'$ using the phase correction values $\phi_0'$ and $\phi_1'$ and the MR image data;

geometrically correct the image $\rho'$ to compensate for Maxwell-term induced distortion to create a new image $\rho$; and calculate a phase perturbation and removing the calculated phase perturbation from the MR reference scan.

18. The computer readable storage medium of claim 17 wherein the computer program further causes the computer to:

calculate new phase correction values $\phi_0$ and $\phi_1$ from the MR reference scan in which a previously calculated phase perturbation had been removed;

reconstruct a new image $\rho''$ using the new phase correction values $\phi_0$ and $\phi_1$, and the MR image data, the new image $\rho''$ having reduced Maxwell-term effects and reduced ghost artifacts in the reconstructed new image $\rho''$.

19. The computer readable storage medium of claim 18 wherein the computer program further causes the computer to:

repeat the step of calculating a phase perturbation and remove the calculated phase perturbation from the MR reference scan and repeat each step of claim 18, until a desired ghost artifact reduction is achieved.

20. The computer readable storage medium of claim 17 wherein the computer program further causes the computer to calculate the phase perturbation according to:

$$\eta_j(x) = arg\left(\int_z \rho(x,z) e^{-i\Psi_{Mj}(z)} dz\right),$$

where arg represents a phase of a complex data set, $\rho(x,z)$ is an image of an object, and $$\Psi_{Mj}(z) = 2\pi\gamma \int_0^{t_j} B_M(t', z) dt',$$

where j is a current echo, $\gamma$ is a gyromagnetic ratio, $B_M$ is a Maxwell term, $t_j$ is a time point of a jth echo center, j ranges from 1, 2, ... N, where N is a total number of echoes, and x is a coordinate of the MR reference scan and is orthogonal to a z spatial coordinate.

21. The computer readable storage medium of claim 17 wherein the computer program further causes the computer to calculate the phase perturbation according to:

$$\eta_j(x) = arg\left(\int_z \rho(x,z) e^{-i[\Psi_{Mj}(z) + \Psi_{Bj}(z)]} dz\right),$$

where arg represents a phase of complex data, x is a coordinate of the MR reference scan and is orthogonal to a z spatial coordinate, and $\Psi_{Mj}(z)$ is given by:

$$\Psi_{Mj}(z) = 2\pi\gamma \int_0^{t_j} B_M(t', z) dt',$$

where j is a current echo, $\gamma$ is a gyromagnetic ratio, $B_M$ is a Maxwell perturbation field, $t_j$ is a time point of a jth echo center, and j ranges from 1, 2, ... N, where N is a total number of echoes, and where $\Psi_{Mj}(z)$ is given by:

$$\Psi_{Bj}(z) = 2\pi\gamma \int_0^{t_j} B(t', z) dt',$$

where B is a perturbation field other than the Maxwell perturbation field.

* * * * *

UNITED STATES PATENT AND TRADEMARK OFFICE
CERTIFICATE OF CORRECTION

PATENT NO. : 6,528,998 B1
DATED : March 4, 2003
INVENTOR(S) : Xiaohong Zhou et al.

It is certified that error appears in the above-identified patent and that said Letters Patent is hereby corrected as shown below:

Column 14,
Line 53, delete "$\Psi_{Mj}(z)$" and substitute therefor -- $\Psi_{Bj}(z)$ --

Signed and Sealed this

Fifteenth Day of July, 2003

JAMES E. ROGAN
*Director of the United States Patent and Trademark Office*